United States Patent
Scheideler et al.

(10) Patent No.: US 7,902,876 B2
(45) Date of Patent: Mar. 8, 2011

(54) METHOD AND DEVICE FOR GENERATING A DIGITAL DATA SIGNAL AND USE THEREOF

(75) Inventors: Dirk Scheideler, Munich (DE); Otto Schumacher, Dachau (DE); Karthik Gopalakrishnan, San Jose, CA (US)

(73) Assignee: Qimonda AG, Munich (DE)

( * ) Notice: Subject to any disclaimer, the term of this patent is extended or adjusted under 35 U.S.C. 154(b) by 405 days.

(21) Appl. No.: 12/058,671

(22) Filed: Mar. 29, 2008

(65) Prior Publication Data
US 2009/0243684 A1 Oct. 1, 2009

(51) Int. Cl.
*H03K 19/00* (2006.01)
(52) U.S. Cl. .......................................... 326/93; 326/26
(58) Field of Classification Search ............... 326/93–98, 326/21, 22
See application file for complete search history.

(56) References Cited

U.S. PATENT DOCUMENTS

| | | | |
|---|---|---|---|
| 5,182,467 A * | 1/1993 | Taylor et al. | 327/175 |
| 6,721,081 B1 * | 4/2004 | Mauro et al. | 359/279 |
| 2002/0097616 A1 | 7/2002 | Schneider et al. | |
| 2005/0273678 A1 | 12/2005 | Dietrich et al. | |

FOREIGN PATENT DOCUMENTS

| | | |
|---|---|---|
| DE | 10102871 C2 | 3/2003 |
| DE | 2004020030 A1 | 11/2005 |

* cited by examiner

*Primary Examiner* — Don P Le
(74) *Attorney, Agent, or Firm* — Patterson & Sheridan, LLP

(57) ABSTRACT

In an embodiment, the present invention relates to an integrated circuit comprising at least one data signal input (data1, data2), at least one clock signal input (Clock), at least one control signal input (Cnt_del1, Cnt_del2) and a data signal output (Data_out). According to the invention, the integrated circuit is configured to provide a digital data signal having a variable symbol duration at its output (Data_out), the symbol duration being controllable by means of the control signal (Cnt_del1, Cnt_del2). A further embodiment of the invention relates to a method for generating a digital data signal having a variable symbol duration in which an output signal is generated by at least one first data signal, at least one first clock signal and at least one control signal. For this purpose, at least one second clock signal is generated from the first clock signal, the second clock signal having a variable delay and the delay being set depending on the value of the at least one control signal. The output signal is formed from the at least one first data signal, whereby the outputting is carried out edge-synchronously to the first and the second clock signal.

22 Claims, 4 Drawing Sheets

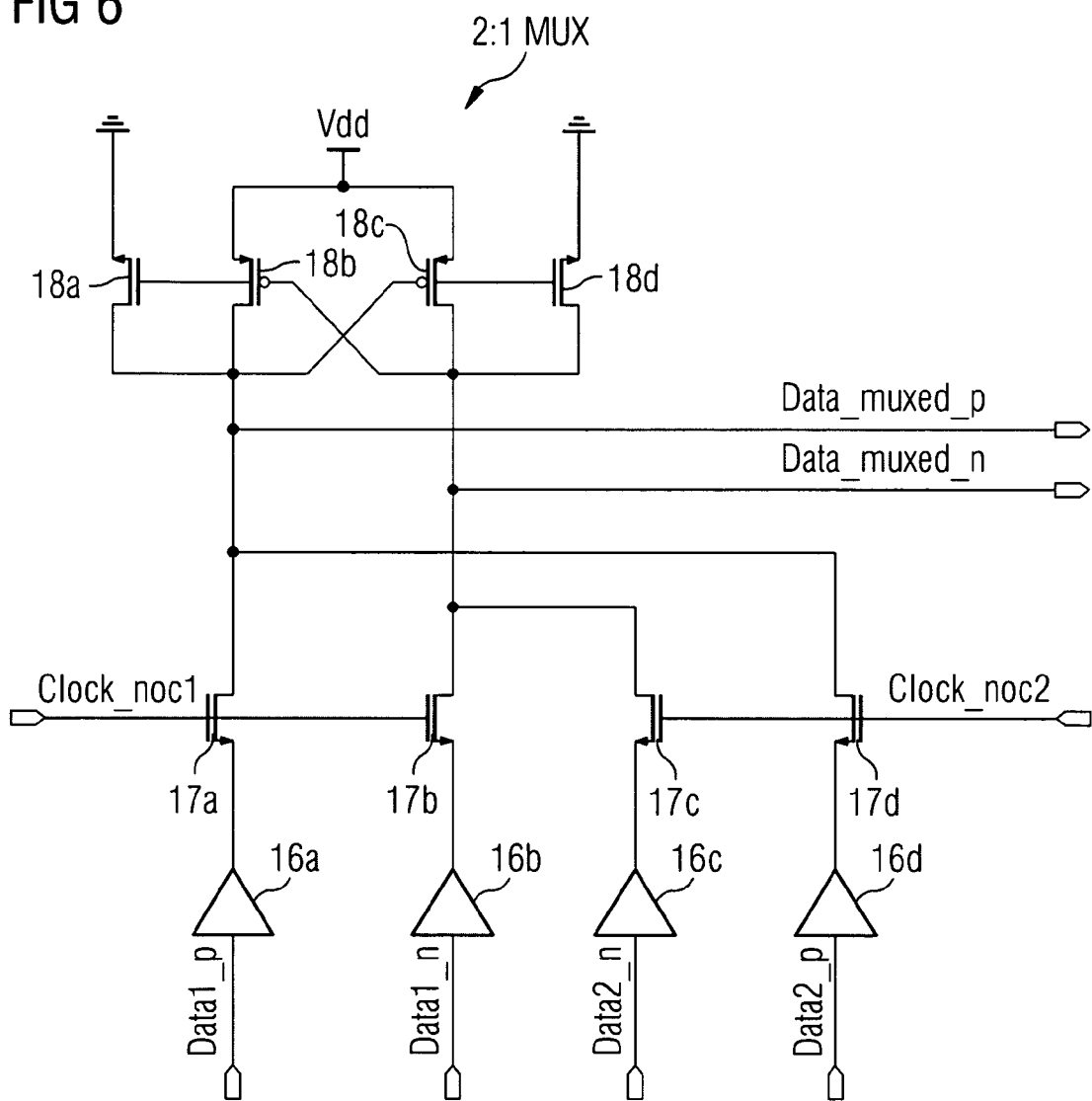

METHOD AND DEVICE FOR GENERATING A DIGITAL DATA SIGNAL AND USE THEREOF

BACKGROUND OF THE INVENTION

Digital semiconductor devices such as logic devices, microprocessors, microcontrollers, digital signal processors or semiconductor memories operate on digitally encoded user data. The user data thereby consist of individual bits which may adopt two logical states. Typically, these two logical states are encoded by two different electrical potentials, e.g. one logical state may be represented by a voltage of 0 V and the other logical state by a voltage of 1.2 V. Of course, any other voltage values may be selected and are commonly used. Between both voltage levels and with sufficient distance thereto, a threshold value is defined at which a voltage deviating from the desired value is assigned to either the one or to the other logical state.

Semiconductor devices of the aforementioned type frequently comprise a plurality of parallel data lines by means of which a plurality of bits may be processed in parallel. The number of lines guided in parallel thereby frequently corresponds to the logical grouping of individual bits. For example, 8 bits may be combined to result in one byte. In this case the semiconductor devices frequently comprise 8, 16 or 32 parallel data lines in order to accordingly be able to process 1, 2 or 4 bytes in parallel.

Typically, more than one bit or more than one byte is sequentially processed by the semiconductor device. In this case the individual symbols, each representing a bit, must have a predefined distance or length in time from each other in order to be recognized as different bits by the semiconductor device.

In order to guarantee the observance of a correct time interval between individual symbols of a data signal, a clock signal is typically provided synchronizing a plurality of semiconductor devices or a plurality of circuits on a single semiconductor device. Thereby, however, inaccuracies occur which may lead to errors when operating the semiconductor device. For example, the data signals may advance or lag with regard to the clock signal. Furthermore, the user is free to provide for clock signals with differing frequencies for different applications of the semiconductor device, so that more or less time is available to the semiconductor device for processing a symbol. The limitations in which reliable operation is guaranteed by the manufacturer of the semiconductor device are usually communicated to the user by the manufacturer of the semiconductor device. First of all, however, the mentioned minimum requirements for the data signals provided for processing have to be detected during the development and manufacturing of the semiconductor devices. Thereafter, a test of the semiconductor devices is carried out in order to verify that the requirements are fulfilled. For this purpose, a data signal with an adjustable symbol duration is required, i.e. a square wave signal having an adjustable duty cycle. For test purposes, such a data signal may be specifically adjusted in such a way that the semiconductor device to be tested is operated at its specification limits. In this way it can be guaranteed that the semiconductor device fulfills these specifications.

Thus, the object underlying the present invention is to provide a method and a device for generating a digital data signal the symbol duration of which is variable and may be adjusted by means of a control signal.

BRIEF DESCRIPTION OF THE DRAWINGS

For a better understanding of the above-described features of the present invention, a more detailed description of the invention briefly summarized above is given in the following with reference to implementations, some of which are depicted in the accompanying drawings. It is to be noted, however, that the drawings only show typical implementations of the present invention and thus do not limit its scope. The invention may admit further equally effective implementations.

FIG. 6 shows an embodiment of a multiplexor by means of which two data signals may be summarized to generate an output signal.

DETAILED DESCRIPTION OF THE PREFERRED EMBODIMENT

Figure 1:
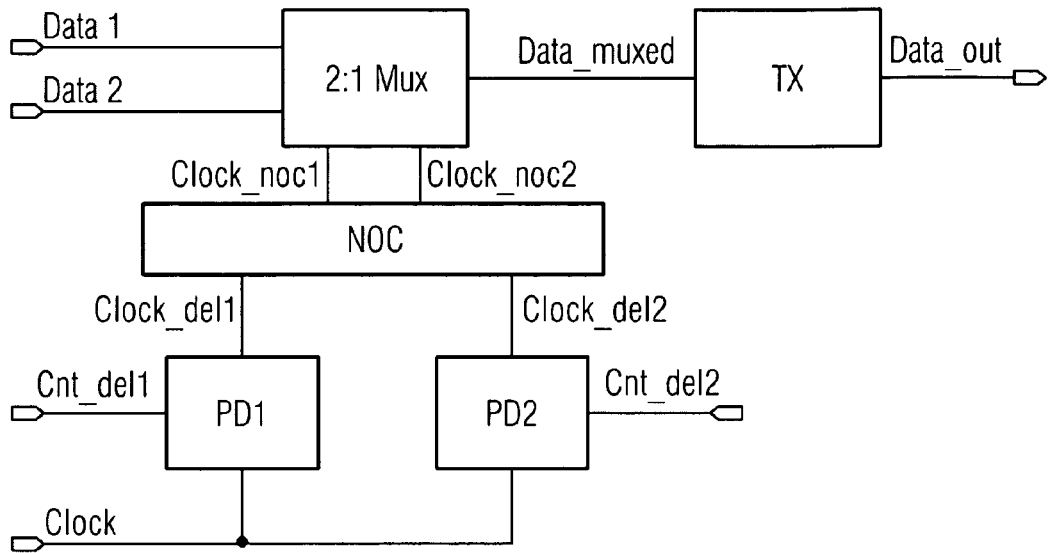
FIG. 1 shows a block diagram of an integrated circuit according to one embodiment.

The invention relates to a device and to a method for generating a digital data signal having a variable duty cycle. Such data signals may be e.g. used for testing semiconductor devices.

In one implementation, the invention relates to an integrated circuit comprising at least one data signal input, at least one clock signal input, at least one control signal input and a data signal output. The integrated circuit is configured to provide a digital data signal with a variable symbol length at its output, the symbol length being controllable by means of the control signal.

In another implementation, the invention relates to an integrated circuit comprising at least one clock signal input, at least one control signal input and at least one delay unit having an input and an output, wherein said input of said delay unit is intended to receive said clock signal and said output is intended to deliver a clock signal having an adjustable delay, wherein the delay is controllable by means of said at least one control signal. Furthermore, the integrated circuit comprises a unit having at least two inputs and at least two outputs, wherein said inputs are adapted to receive at least two clock signals, one of said clock signals being delayed with respect to the other and wherein said outputs are adapted to provide at least two clock signals, whereby any of said output clock signals does not simultaneously assume a predetermined logical state. The integrated circuit comprises further at least two data signal inputs, at least one data signal output and a multiplexor having at least two signal inputs which are coupled to said at least two data signal inputs, at least two clock signal inputs which are coupled to the outputs of said unit having at least two inputs and at least two outputs which is adapted to provide at least two clock signals. The multiplexor is adapted to provide an output signal selected from said at least two data signals and being outputted edge-synchronous to the first and second clock signal.

In still another implementation, the invention relates to a test device for semiconductor devices comprising an integrated circuit, said integrated circuit comprising at least one clock signal input, at least one control signal input and at least one delay unit having an input and an output, wherein said input of said delay unit is intended to receive said clock signal and said output is intended to deliver a clock signal having an adjustable delay, wherein the delay is controllable by means of said at least one control signal. Furthermore, the integrated circuit comprises a unit having at least two inputs and at least two outputs, wherein said inputs are adapted to receive at least two clock signals, one of said clock signals being delayed with respect to the other and wherein said outputs are adapted to provide at least two clock signals, whereby any of said output clock signals does not simultaneously assume a predetermined logical state. The integrated circuit comprises further at least two data signal inputs, at least one data signal output and a multiplexor having at least two signal inputs which are coupled to said at least two data signal inputs, at least two clock signal inputs which are coupled to the outputs of said unit having at least two inputs and at least two outputs which is adapted to provide at least two clock signals. The multiplexor is adapted to provide an output signal selected from said at least two data signals and being outputted edge-synchronous to the first and second clock signal.

In still another implementation, the invention relates to a method for generating a digital data signal having a variable symbol length in which an output signal is generated from at least one first data signal, at least one first clock signal and at least one control signal. At least one second clock signal is generated from the first clock signal, the second clock signal comprising a variable delay and the delay being set depending on the value of the at least one control signal. The output signal is generated from the at least one first data signal, wherein said second data signal is edge-synchronous to the first and second clock signal.

In still another implementation, the invention relates to a method for testing a semiconductor device, comprising the step of coupling a data signal having a variable symbol length to at least one input of the semiconductor device under test, wherein said data signal having a variable symbol length is generated by means of a method comprising the steps of providing at least one first data signal, at least one first clock signal and at least one control signal. At least one second clock signal is generated from the first clock signal, the second clock signal comprising a variable delay and the delay being set depending on the value of the at least one control signal. The data signal having a variable symbol length is generated from the at least one first data signal, wherein said data signal having a variable symbol length is edge-synchronous to the first and second clock signals.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one implementation" or "an implementation" means that a particular feature, structure, or characteristic described in connection with the implementation is included in at least one embodiment of the present invention. Thus, the appearance of the phrases "in one implementation" or "in an implementation" in various places throughout the specification are not necessarily all referring to the same implementation. Furthermore, the particular features, structures, or characteristics may be combined in any suitable manner in one or more embodiments.

Moreover, inventive aspects lie in less than all features of a single disclosed implementation. Thus, the claims following the Detailed Description are hereby expressly incorporated into this Detailed Description, with each claim standing on its own as a separate implementation of this invention.

FIG. 1 illustrates a block diagram for an integrated circuit according to one embodiment. The functional units illustrated in FIG. 1 may be implemented either in hardware or in software. The functional units may be implemented in the form of an integrated circuit on a single silicon substrate in order to guarantee that the interconnecting lines between various functional units may be kept as short as possible. Furthermore, an individual integrated circuit may allow protection against interfering radiation from outside. Furthermore, differing thermal drifts, which may lead to inaccuracies during the signal processing between the individual functional units, may be minimized.

The embodiment illustrated in FIG. 1 may utilize a multiplexor 2:1 Mux in order to generate the data stream for testing the semiconductor device. The multiplexor 2:1 Mux thereby selects the output data stream Data_muxed from two input signals Data 1 and Data 2. In other embodiments, a larger or smaller number of data streams may be used for generating the output data stream Data_muxed.

In one embodiment, the signal input Data2 may have a fixed connection with a predetermined potential which clearly characterizes a logical state. A changing data signal on the input Data1, which e.g. consists of multiple transitions of the logic values 0 and 1, may be composed with a fixed data signal on the input Data2, which only consists e.g. of the value 0. Alternatively, two changing data signals Data1 and Data2 may also be composed to generate an output signal Data_muxed in another embodiment. In still another embodiment, it may also be possible to summarize more than two data signals in the multiplexor unit 2:1 Mux to generate an output data signal Data_muxed.

The signal Data-muxed provided for testing a semiconductor device may optionally be processed in an amplifier TX before being used for testing a semiconductor device. The amplifier TX may thereby e.g. increase or reduce the electrical voltage of the data signal. Furthermore, the amplifier TX may be provided for increasing the electrical current of the output signal. Optionally, the amplifier TX may also be provided in order to keep the signal power as it stands, while adjusting other parameters of the signal. For example, the amplifier TX may in this case comprise an impedance matching unit, a high-pass filter, a low-pass filter or a band-pass filter. In a further embodiment, the amplifier TX may be adapted to provide a plurality of the mentioned functions. In another embodiment, the amplifier TX may be omitted.

In order to examine the behavior of the semiconductor device to be tested at different symbol durations of the data signal, the symbol duration of the output signal Data_muxed may be set. For this purpose, the multiplexor unit 2:1 Mux may comprise two clock signal inputs Clock_noc1 and Clock_noc2. The multiplexor unit 2:1 Mux may be adapted to output data symbols on the output line Data_muxed edge-synchronously to both clock signals. In the case that the received clock signals comprise a phase shift which is not 180° or a multiple of 180°, the data symbols on the data line Data_muxed may be outputted irregularly, i.e. the symbol length of the output signal varies. The circuit components connected upstream of the clock signal inputs of the multiplexor unit 2:1 Mux may serve to generate such clock signals Clock_noc1 and Clock_noc2 with adjustable phase shifts.

In the circuit components PD1, PD2 and NOC, one single clock signal Clock may be divided up into two clock signals Clock_del1 and Clock_del2. In one embodiment, both clock signals Clock_del1 and Clock_del2 may not simultaneously assume a logical state which would lead to a short circuit of data signal Data1 and data signal Data 2.

According to the embodiment illustrated in FIG. 1, two clock signals Clock_del1 and Clock_del2 may be generated with a controllable phase shift by dividing up the first clock signal Clock by means of two delay units PD1 and PD2. The delay of each delay unit may be set by means of a control signal Cnt_del1 and Cnt_del2. If both delay units PD1 and PD2 add a constant delay to the incoming clock signal Clock, the phase shift between the two output signals Clock_del1 and Clock_del2 is 0°. Similarly, in the case that one signal is delayed by a multiple of the period of the clock signal, the phase shift equals 0°. If the transit time difference of the input signal Clock in the delaying elements PD1 and PD2 corresponds to the half of the period, the phase shift of the clock signals Clock_del1 and Clock_del2 is 180°. This may result in a data signal having a constant symbol length being outputted at the output of the multiplexor unit 2:1 Mux edge-synchronously to the clock signals Clock_del1 and Clock_del2. For all intermediate values, the symbol length of the data signal Data_muxed differs, thereby providing a data signal with adjustable duty cycle.

Those skilled in the art may recognize that operating one delay unit PD1 with a constant delay value and to render the delay of the other delay unit PD2 adjustable may be sufficient to set the transit time difference between both clock signals. In another embodiment, said delay unit having a fixed value may be replaced by an interconnect having a fixed delay depending on its length.

Delay units PD1 and PD2 as such are well known to those skilled in the art. For example, the transit time of a logic gate, e.g. an inverter may be used for delaying the signal. By changing the number of serially connected logic gates in the signal path, the transit time and thereby the delay added may be adjusted in discrete steps. Similarly, the transit time may be altered by adjusting the conductor length between the clock signal input and the subsequent circuit components.

Depending on the design of the selected delay element PD1, PD2, an analogue or digital control signal may be used for adjusting the delay in the delaying elements PD1 and PD2. Thereby, it is known to those skilled in the art that a control signal can be transmitted on more than one physical conductor. For example, the delay may be encoded as a digital value with a plurality of bits, these bits being transmitted by a plurality of parallel lines Cnt_del. The control signal itself may be generated by a microcontroller, by a microprocessor or by a digital finite state machine, which is part of a semiconductor test device comprising the integrated circuit described. Alternatively, the control signal may also be set by means of a DIP switch or a register writable from the outside. An analogue control signal Cnt_del may also be generated by means of a voltage divider or a D/A-converter.

If the unit 2:1 Mux switches a data signal to the output for composing the data signals Data1 and Data2 as long as the associated clock signal Clock_noc1 and Clock_noc2 shows a predeterminable logical state, e.g. 1, a unit NOC may be provided in order to prevent two clock signals from simultaneously assuming this state. This ensures a separation of the data bits from the signal Data1 and Data2 in the output signal Data_muxed and prevents a short circuit of the input signals. Implementations for the unit NOC are depicted in FIGS. 2 and 3.

In a further embodiment, the multiplexor 2:1 Mux may not operate on a point in time given by a predetermined logical state of the clock signal but on a change of a state, i.e. an edge of the clock signal. In this case, the unit NOC may be omitted.

Figure 2:
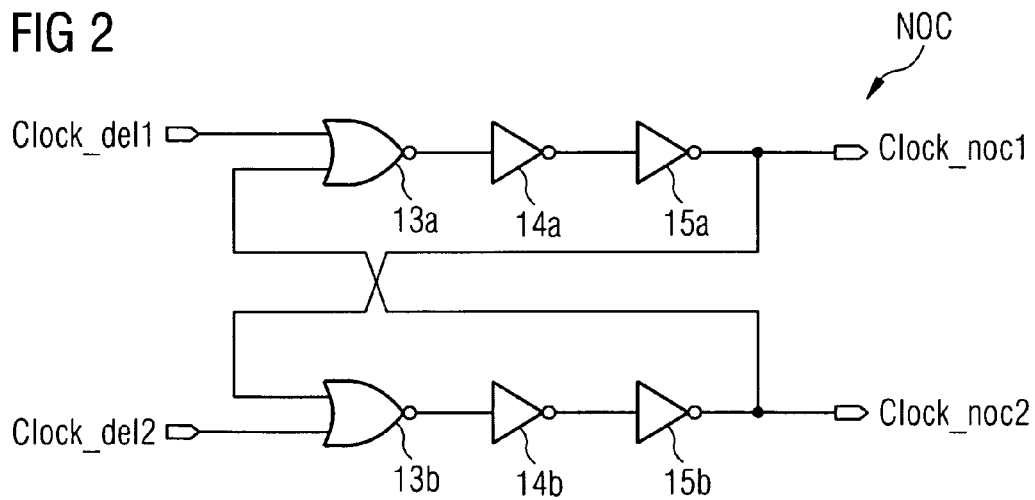
FIG. 2 shows an embodiment of a unit for generating two clock signals which provides for the fact that these clock signals do not simultaneously assume a predeterminable logical state.
Figure 3:
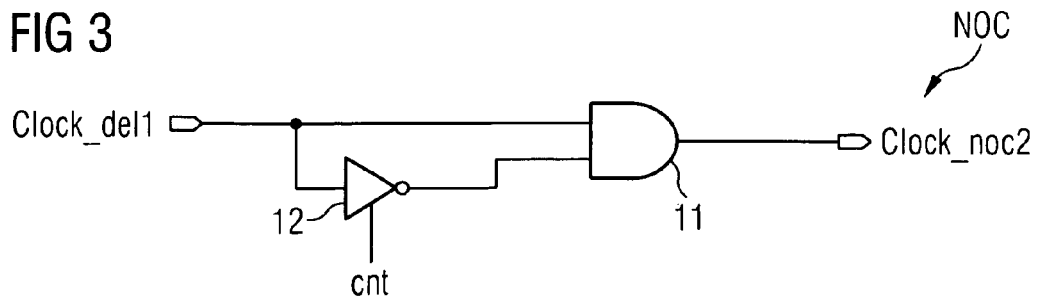
FIG. 3 shows a further embodiment of the unit which prevents two clock signals from simultaneously assuming a predeterminable logical state.

FIG. 2 shows the unit NOC according to one embodiment. The unit NOC may consist of two NOR elements 13a and 13b. Two inverters 14a and 15a or 14b and 15b, respectively, may be connected downstream thereto. The inverters 14a, 14b, 15a and 15b thereby act as delaying elements.

A set of two clock signals having a fixed phase relation Clock_del1 and Clock_del2 may be each coupled to a respective input of a NOR element 13a and 13b. The second input of the NOR element may be coupled to the output of the respective other NOR element. Since any of said NOR elements 13a and 13b outputs a logical "0" as soon as one input assumes the logical value "1", it is ensured that only one of the two outputs Clock_noc1 and Clock_noc2 can acquire the logical state "1" at the same time.

Figure 4:
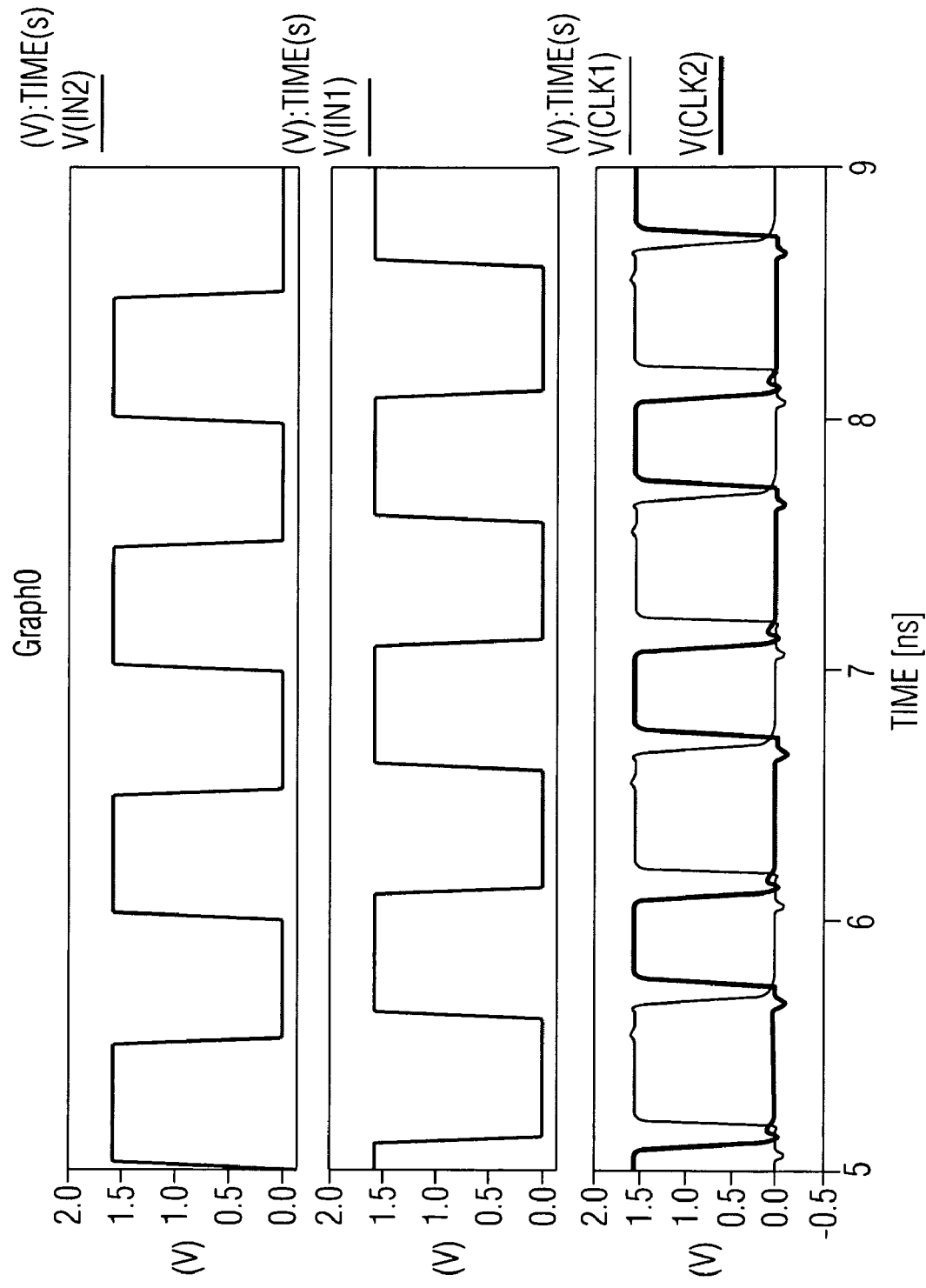
FIG. 4 shows a timing diagram depicting two clock signals prior to and after processing by means of the circuit of FIG. 2.

A timing diagram of the clock signals at the input and output of the circuit shown in FIG. 2 is illustrated in FIG. 4. Line 1 and 2 of FIG. 4 show an example for input signals Clock_del1 and Clock_del2. Both input signals Clock_del1 and Clock_del2 comprise a period of 1 ns or a frequency of 1 GHz, respectively. The signals have a phase shift of approximately 48° with regard to each other or a relative delay of 135 ps, respectively. In this embodiment, the output Clock_noc1 is a logical 1 if the input Clock_del1 is a logical 1 and the input Clock_del2 is at the same time a logical 0. The remaining time, the output Clock_noc1 is 0. Thereby, the duty cycle of the signal Clock_noc1 is reduced compared to the duty cycle Clock_del1 by the absolute value of the phase shift. The duty cycle of the output signal Clock_noc2 relative to the input signal Clock_del2 shows a complementary behavior thereto. In this case, the duty cycle is increased by the absolute value of the phase shift. Thus, two clock signals which never adopt the same logical state and which have different duty cycles are provided at the output of the unit NOC. By outputting the data signal Data_muxed clock-synchronously to the clock signals Clock_noc1 and Clock_noc2, symbol length of the output signal Data_muxed differs from the symbol length of the input data signal. Furthermore, the symbol length of the output signal changes every second symbol. This signal may now be used as a data signal for testing a semiconductor device.

FIG. 3 shows another embodiment of the unit NOC. The embodiment shown in FIG. 3 uses an AND element 11, which may receive the signal Clock_del1 as a first input signal. The second input signal may also consist of the signal Clock_del1 after the signal Clock_del1 has been delayed in a delay element 12. When the input signal Clock_del1 changes its state, e.g. exhibiting a rising edge from 0 to 1, this is immediately registered by the first input of the AND element, but delayed by the second input. During this delay time, similar logical states are applied at the input of the AND element 11. Thus, the AND element outputs the logical state 1 only during this time. In a further embodiment, the delay of the delay element 12 and thus the pulse duration may be set via a control signal Cnt.

The delay of the delay element 12 and thus the pulse duration at the output of the AND element 11 should be set to be shorter than the minimum phase shift of the clock signals Clock_del1 and Clock_del2. By this measure, it may be achieved that at the outputs of the unit NOC two clock signals Clock_noc1 and Clock_noc2 are available which do not acquire a predeterminable logical state such as "1" at the same time. Of course, one of ordinary skill in the art may decide from case to case to avoid the other logical state "0".

Figure 5:
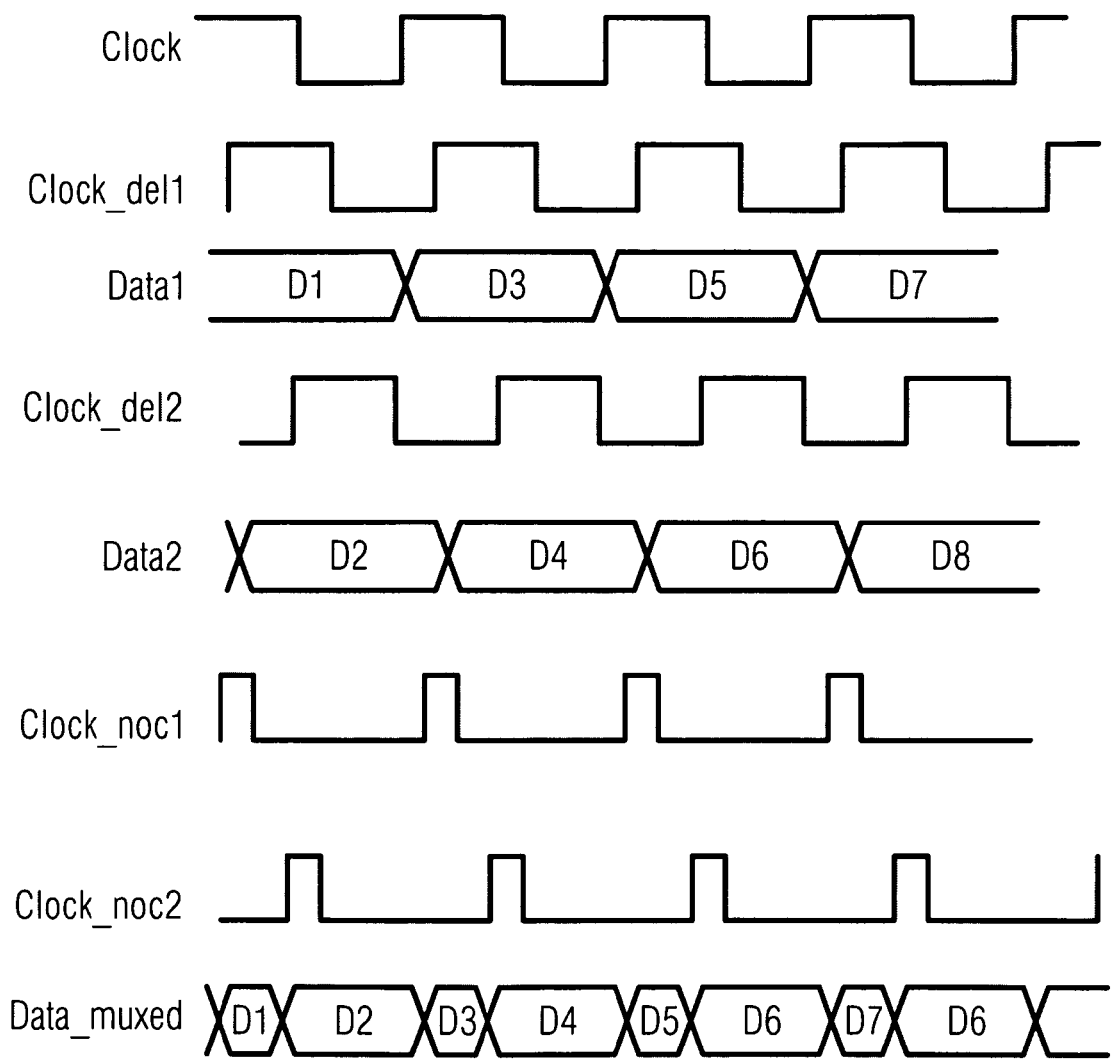
FIG. 5 shows a timing diagram of 8 signals which occur in the block diagram of FIG. 1.

A timing diagram which illustrates the output signals of the unit described with respect to FIG. 3 is shown in FIG. 5. In line 1, FIG. 5 shows a clock signal Clock which serves as an input signal of the circuit shown in FIG. 1. Furthermore, line 3 of FIG. 5 shows a first data signal Data1 which is delivered clock-synchronously to the clock signal Clock to a first input of the unit 2:1 Mux. Line 5 of FIG. 5 depicts a second data signal Data2 which is delivered to a second input of the unit 2:1 Mux in a clock-synchronous manner with regard to a further clock signal (not shown).

By means of two delay elements PD1 and PD2, two clock signals may be generated from the clock signal Clock. By means of a different delay added by each of the delay elements PD1 and PD2, a phase shift may be generated. In the example shown in FIG. 5, the clock signal Clock_del1 is delayed by approximately a quarter of the period. The clock signal Clock_del2 is delayed by approximately half a period. Thus, the clock signal Clock_del1 comprises a delay of approximately a quarter clock cycle with respect to the clock signal Clock_del2. This means that both signals have the same logical state during a quarter work cycle.

According to the embodiment of FIG. 5, the simultaneous applying of the logical state 1 to both delayed clock signals is to be avoided. Therefore, a unit NOC may be provided comprising a circuit as shown in FIG. 3 for each signal path. The circuit may generate a positive square wave pulse the duration of which is less than a quarter period of the clock signal Clock_del1 or Clock_del2. In this manner, two square wave pulses Clock_noc1 and Clock_noc2 may be generated which never simultaneously assume the logical state 1 at the same time. This is shown in line 6 and 7 of FIG. 5. The unit 2:1 Mux may be configured to output the data signals Data1 and Data2 edge-synchronously with regard to the clock signal Clock_noc1 and Clock_noc2. As a result, both data signals Data1 and Data2 are available as a single multiplexed signal at the output Data_muxed. However, the symbol length at the output signal differs. As shown in line 8 of FIG. 5, in the selected implementation the symbol length of the data of the signal Data1 is shorter than the symbol length of the data of the input signal Data2. Of course, one skilled in the art is free to choose a different duty cycle in the output data stream Data_muxed by adapting the difference of the delays in the delay elements PD1 and PD2. The data stream Data_muxed is now available for testing a semiconductor device, if required after amplification by the amplifying element TX.

FIG. 6 shows an embodiment of the unit 2:1 Mux. The unit 2:1 Mux according to FIG. 6 may operate on differential signals. This means that each input signal Data 1 and Data 2 as well as the output signal Data_muxed is available twice. This results in an increased reliability and higher signal-to-noise-distance. Of course, the skilled person is free to modify the circuit depicted in FIG. 6 and to only use one single signal Data1, Data2 and Data_mux.

According to FIG. 6, each input signal Data1_p, Data1_n, Data2_n and Data2_p may be received by an associated input amplifier 16a, 16b, 16c and 16d. The input amplifiers 16a, 16b, 16c and 16d may be used for impedance matching purposes. In a further embodiment, the input amplifiers 16 may also comprise Schmitt triggers, feed-forward equalizers or similar circuits in order to improve the signal shape and to remove artifacts or the like from the input signals. The input amplifiers 16a, 16b, 16c and 16d are optional and may be omitted in other embodiments of the present invention.

Every input signal now reaches an associated switching element 17a, 17b, 17c and 17d. In the embodiment shown in FIG. 6, a field effect transistor may be used as a switching element. In other embodiments, other switching elements may be used, e.g. bipolar transistors. In order to increase reliability, each switching element 17 may consist of a plurality of transistors.

The switching elements 17a and 17b may be controlled by the first clock signal Clock_noc1. The further switching elements 17c and 17d may be controlled by the second clock signal Clock_noc2. This results in the respective data signal being forwarded to the respective output Data_muxed if the clock signal comprises a predeterminable logical state, which is "1" in the embodiment shown. As discussed above, in the embodiment, where both clock signals Clock_noc1 and Clock_noc 2 never assume this logical state simultaneously, both data inputs Data1 and Data 2 are never switched to the output Data_muxed at the same time. The data are therefore outputted as a serial sequence, as indicated in line 8 of FIG. 5.

In order to preserve the logical state given by the input signal Data1_p, Data1_n, Data2_n or Data2_p at the data output Data_muxed even if the associated data input was separated from the output by means of the switching elements 17a, 17b, 17c and 17d, further switching elements 18a, 18b, 18c and 18c may be provided which connect the output either to a low potential such as a ground potential, or to a high potential, such as a supply voltage $V_{DD}$. Since each voltage level encodes a logical state, this logical state may be maintained by means of the switching elements 18a, 18b, 18c and 18d until an alternating input signal is provided to the output Data_muxed via one of the switching elements 17a, 17b, 17c and 17d.

Of course, FIG. 6 is only one embodiment for the unit 2:1 Mux. Further embodiments, which may deviate from FIG. 6, are also contemplated.

While the invention has been described in terms of several implementations, those skilled in the art will recognize that the invention is not limited to the implementations described, but can be practiced with modification and alteration within the spirit and scope of the appended claims. The description is thus to be regarded as illustrative instead of limiting.

What is claimed is:

1. An integrated circuit, comprising:
   at least one data signal input;
   at least one clock signal input;
   at least one control signal input;
   at least one data signal output, wherein the integrated circuit is configured to provide a digital data signal having a variable symbol length at its output, whereby said data signal is formed from said data signal and said clock signal, and wherein the symbol length may be controlled by means of said control signal; and
   at least one delay unit having an input and an output, wherein said input of said delay unit is configured to receive a clock signal and said output is configured to deliver a clock signal having an adjustable delay, wherein the delay is controllable by means of said at least one control signal.

2. The integrated circuit according to claim 1, further comprising a multiplexor which is coupled to at least two data signal inputs and selects between said at least two data signal inputs, and provides the at least two data signal inputs at one single data signal output.

3. The integrated circuit according to claim 1, further comprising a power amplifier comprising an input and an output, wherein the output of said power amplifier is adapted to form said at least one data signal output.

4. The integrated circuit according to claim 1, further comprising two delay units each having an input and an output, wherein any of said inputs of said delay units are capable of receiving said clock signal and said outputs are capable of delivering a clock signal having an adjustable delay, wherein any of said delays are controllable by means of said at least one control signal and wherein any of said two delay units are capable of providing a different delay in order to two clock signals having a predetermined phase difference.

5. The integrated circuit according to claim 1, wherein any of said delay units are adapted to receive a digital signal as said control signal.

6. The integrated circuit according to claim 1, which is arranged on one single semiconductor die.

7. An integrated circuit, comprising:
at least one data signal input;
at least one clock signal input;
at least one control signal input;
at least one data signal output, wherein the integrated circuit is configured to provide a digital data signal having a variable symbol length at its output, whereby said data signal is formed from said data signal and said clock signal, and wherein the symbol length may be controlled by means of said control signal; and
a unit having at least two inputs and at least two outputs, wherein said inputs are adapted to receive at least two clock signals having a phase difference and wherein said outputs are adapted to provide at least two clock signals, whereby any of said output clock signals do not simultaneously assume the same predeterminable logical state.

8. The integrated circuit according to claim 7, wherein said unit having at least two inputs and at least two outputs unit comprises at least one pulse generator which generates a square wave pulse with a predeterminable length in time at one of said outputs after the occurrence of a predeterminable edge of a clock signal at one of said inputs.

9. The integrated circuit according to claim 8, further comprising a programming input which is adapted to receive a programming signal by means of which the length in time of the square wave pulse may be set.

10. An integrated circuit, comprising:
at least one clock signal input;
at least one control signal input;
at least one delay unit having an input and an output, wherein said input of said delay unit receives said clock signal and said output delivers a clock signal having an adjustable delay, wherein the delay is controllable by means of said at least one control signal;
a unit having at least two inputs and at least two outputs, wherein said inputs are adapted to receive at least two clock signals, one of said clock signals being delayed with respect to the other, and wherein said outputs are adapted to provide at least two clock signals, whereby any of said output clock signals do not simultaneously assume the same predetermined logical state;
at least two data signal inputs;
at least one data signal output; and
a multiplexor, comprising:
at least two signal inputs which are coupled to said at least two data signal inputs; and
at least two clock signal inputs which are coupled to the outputs of said unit having at least two inputs and at least two outputs which is adapted to provide at least two clock signals, wherein the multiplexor provides an output signal selected from said at least two data signals, and wherein the at least two data signals are outputted edge-synchronous to the first and second clock signal.

11. The integrated circuit according to claim 10, further comprising a power amplifier comprising an input and an output, wherein the input of said power amplifier is coupled to the output of said multiplexor and the output of said power amplifier is adapted to form said at least one data signal output.

12. The integrated circuit according to claim 10, wherein said unit having at least two inputs and at least two outputs comprises at least one pulse generator which generates a square wave pulse with a predetermined length in time at one of said outputs after the occurrence of a predetermined edge of a clock signal at one of said inputs.

13. A test device for a semiconductor device comprising an integrated circuit, said integrated circuit comprising:
at least one clock signal input;
at least one control signal input;
at least one delay unit having an input and an output, wherein said input of said delay unit receives said clock signal and said output delivers a clock signal having an adjustable delay, wherein the delay is controllable by means of said at least one control signal;
a unit having at least two inputs and at least two outputs, wherein said inputs are adapted to receive at least two clock signals, one of said clock signals being delayed with respect to the other, and wherein said outputs are adapted to provide at least two clock signals, whereby any of said output clock signals do not simultaneously assume the same predetermined logical state;
at least two data signal inputs;
at least one data signal output, wherein the at least one data signal output is coupled to at least one input of the semiconductor device under test; and
a multiplexor, comprising:
at least two signal inputs which are coupled to said at least two data signal inputs which are coupled to the outputs of said unit having at least two inputs and at least two outputs which is adapted to provide at least two clock signals, wherein the multiplexor is adapted to provide an output signal selected from said at least two data signals, and wherein the at least two data signals are outputted edge-synchronous to the first and second clock signal.

14. A method for generating a digital data signal having a variable symbol duration, the method comprising:
providing at least one first data signal;
providing at least one first clock signal;
providing at least one control signal;
generating at least one second clock signal from the first clock signal, the second clock signal comprising a variable delay and the delay being set depending on the value of the at least one control signal; and
generating a second data signal from the at least one first data signal, wherein said second data signal is edge-synchronous to the first and second clock signal.

15. The method according to claim 14, wherein said second data signal is selected from at least two first data signals by means of a multiplexor.

16. The method according to claim 14, wherein said second data signal is amplified prior to being outputted.

17. The method according to claim 14, wherein said at least one first clock signal is split into two clock signals having a phase difference, the phase difference being determined by the value of said at least one control signal.

18. The method according to claim 17, wherein the phase difference between said first and second clock signal is constituted by delaying at least one of said clock signals.

19. The method according to claim 14, wherein said at least one control signal is digitally encoded.

20. The method according to claim 14, wherein said two clock signals are coordinated in such a way that they do not simultaneously assume the same predeterminable logical state.

21. A method for testing a semiconductor device, comprising:
coupling a data signal having a variable symbol length to at least one input of the semiconductor device under test, wherein said data signal having a variable symbol length is generated by means of a method comprising:

providing at least one first data signal having a constant symbol length;

providing at least one first clock signal;

providing at least one control signal;

generating at least one second clock signal from the first clock signal, the second clock signal comprising a variable delay and the delay being set depending on the value of the at least one control signal; and generating said data signal having a variable symbol length from the at least one first data signal, wherein said second data signal is edge-synchronous to the first and second clock signals.

22. The method according to claim 21, wherein the symbol duration of said data signal being provided to said semiconductor device under test is changed during testing by changing said at least one control signal.

* * * * *